United States Patent
Kim et al.

(10) Patent No.: US 11,024,438 B2
(45) Date of Patent: Jun. 1, 2021

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Min Kyoung Kim, Daejeon (KR); Yu Ho Min, Daejeon (KR); Cheol Hee Park, Daejeon (KR); Kyung Moon Ko, Daejeon (KR); Chee Sung Park, Daejeon (KR); Myung Jin Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 27 days.

(21) Appl. No.: 16/462,179

(22) PCT Filed: Jun. 5, 2018

(86) PCT No.: PCT/KR2018/006424
§ 371 (c)(1),
(2) Date: May 17, 2019

(87) PCT Pub. No.: WO2018/226023
PCT Pub. Date: Dec. 13, 2018

(65) Prior Publication Data
US 2019/0334071 A1    Oct. 31, 2019

(30) Foreign Application Priority Data
Jun. 7, 2017 (KR) .................. 10-2017-0070918

(51) Int. Cl.
*H01B 1/06* (2006.01)
*C01G 5/00* (2006.01)
(Continued)

(52) U.S. Cl.
CPC ............. *H01B 1/06* (2013.01); *C01B 19/002* (2013.01); *C01G 5/006* (2013.01); *C01G 19/006* (2013.01); *C01G 29/006* (2013.01); *H01L 35/16* (2013.01)

(58) Field of Classification Search
CPC ........ H01B 1/06; C01B 19/002; C01G 5/006; C01G 19/006; C01G 29/006; H01L 35/16; H01L 35/18
See application file for complete search history.

(56) References Cited

U.S. PATENT DOCUMENTS 5,994,639 A * 11/1999 Johnson .................. H01L 35/16
136/236.1
6,312,617 B1 * 11/2001 Kanatzidis ............ H01L 31/032
252/62.3 T
(Continued)

FOREIGN PATENT DOCUMENTS

JP    2003-188425 A    7/2003
JP    2007-505028 A    3/2007
(Continued)

OTHER PUBLICATIONS

Hijikata et al. ("Bi substitution effects on superconductivity of valence-skip superconductor AgSnSe2," Journal of the Physical Society of Japan, May 15, 2017, vol. 86, No. 5) (Year: 2017).*

(Continued)

*Primary Examiner* — Matthew R Diaz
(74) *Attorney, Agent, or Firm* — Birch, Stewart, Kolasch & Birch, LLP

(57) ABSTRACT

A chalcogen-containing compound of the following Chemical Formula 1 which exhibits excellent phase stability even at a low temperature, particularly at a temperature corresponding to an operating temperature of a thermoelectric element, and also exhibits a significantly superior power factor and thermoelectric performance index due to its (Continued)

excellent electrical conductivity and low thermal conductivity caused by its unique crystal lattice structure, a method for preparing the same, and a thermoelectric element including the same. [Chemical Formula 1]—$V_{1-2x}Sn_4Bi_{2-x}Ag_{3x}Se_7$, wherein V is vacancy and $0<x<0.5$.

13 Claims, 11 Drawing Sheets

(51) Int. Cl.
    *C01G 19/00*     (2006.01)
    *C01G 29/00*     (2006.01)
    *H01L 35/16*     (2006.01)
    *C01B 19/00*     (2006.01)

(56) References Cited

U.S. PATENT DOCUMENTS

| | | | |
|---|---|---|---|
| 7,592,535 B2 * | 9/2009 | Kanatzidis | H01L 35/14 136/238 |
| 8,481,843 B2 * | 7/2013 | Kanatzidis | H01L 35/16 136/241 |
| 2005/0076944 A1 | 4/2005 | Kanatzidis et al. | |
| 2007/0107764 A1 | 5/2007 | Kanatzidis et al. | |
| 2010/0139730 A1 * | 6/2010 | Bentien | C30B 15/00 136/201 |

FOREIGN PATENT DOCUMENTS

| | | |
|---|---|---|
| JP | 2008-512001 A | 4/2008 |
| JP | 2015-233055 A | 12/2015 |
| JP | 2017-45841 A | 3/2017 |
| KR | 10-1323319 B1 | 10/2013 |
| KR | 10-2017-0041540 A | 4/2017 |
| KR | 10-2018-0048313 A | 5/2018 |

OTHER PUBLICATIONS

Adouby et al., "Structure and temperature transformation of SnSe. Stabilization of a new cubic phase $Sn_4Bi_2Se_7$", Z. Kristallogr., 213, (1998), pp. 343-349.
Adouby et al., "X-ray diffraction, $^{119}$Sn Mössbauer and thermal study of SnSe—$Bi_2Se_3$ system", Journal of Alloys and Compounds, 453, (2008), pp. 161-166.
International Search Report for PCT/KR2018/006424 (PCT/ISA/210) dated Oct. 1, 2018.

* cited by examiner

CHALCOGEN-CONTAINING COMPOUND, ITS PREPARATION METHOD AND THERMOELECTRIC ELEMENT COMPRISING THE SAME

CROSS-REFERENCE TO RELATED APPLICATION(S)

This application claims the benefits of the filing date of Korean Patent Application No. 10-2017-0070918 filed with the Korean Intellectual Property Office on Jun. 7, 2017, the entire content of which is incorporated herein by reference.

TECHNICAL FIELD

The present invention relates to a novel chalcogen-containing compound which exhibits excellent phase stability even at a low temperature, particularly in an operating temperature range of a thermoelectric element, and also exhibits excellent thermoelectric properties along with low thermal conductivity, a method for preparing the same, and a thermoelectric element including the same.

BACKGROUND ART

Recently, due to resource depletion and environmental problems caused by combustion, research on thermoelectric conversion materials using waste heat as one of alternative energies has accelerated.

The energy conversion efficiency of thermoelectric conversion materials depends on ZT, which is the thermoelectric performance index value of the thermoelectric conversion material. ZT is determined according to the Seebeck coefficient, electrical conductivity, thermal conductivity, and the like as shown in the following Equation 1, and more specifically, it is proportional to the square of the Seebeck coefficient and the electrical conductivity, and is inversely proportional to thermal conductivity.

$$ZT = S^2 \sigma T/K \quad \text{[Equation 1]}$$

(In Equation 1, σ is the electrical conductivity, S is the Seebeck coefficient, K is the thermal conductivity, and T is an absolute temperature).

Therefore, in order to increase the energy conversion efficiency of the thermoelectric conversion element, it is necessary to develop a thermoelectric conversion material having a high Seebeck coefficient (S) or high electrical conductivity (σ) and thus exhibiting a high power factor ($PF = \sigma S^2$) or having low thermal conductivity (K).

Among various thermoelectric conversion materials which have been known for a long time, for example, a thermoelectric conversion material having a crystal lattice structure related to or similar to sodium chloride (NaCl), such as PbTe, $Bi_2Te_3$, SnSe, or the like, in which some of lattice sites are vacant, is known to exhibit excellent thermoelectric conversion characteristics. Materials having such a crystal lattice structure exhibit excellent electrical conductivity, and also exhibit low thermal conductivity as some of the lattice sites are vacant. Thus, excellent thermoelectric conversion characteristics can be exhibited.

However, a thermoelectric conversion material having vacancies in which some of the lattice sites are vacant while having the same face-centered cubic lattice structure as that of sodium chloride, as shown in FIG. 1, is almost unknown. In the case of $Sn_4Bi_2Se_7$, however, which is one of the Sn—Bi—Se based chalcogen compounds, it has the same face-centered cubic lattice structure as that of sodium chloride, and it is known that some lattice sites are vacant. For reference, FIG. 2 illustrates a phase stability diagram of typical Sn—Bi—Se based chalcogen compounds, and in the case of $Sn_4Bi_2Se_7$, it is known to have a face-centered cubic lattice structure at a temperature of about 580° C. to 720° C. (a portion indicated by a circle in FIG. 2).

However, in the case of these chalcogen-containing compounds, the phase is stably maintained only at a temperature of about 580 to 720° C., and decomposition occurs in other phases at a temperature lower than this temperature, particularly at an operating temperature of the thermoelectric element, and thus phase stability is not exhibited.

As a result, it has been predicted that chalcogen-containing compounds exhibit the same face-centered cubic lattice structure as that of sodium chloride and include some vacant lattice sites and thus exhibit low thermal conductivity and excellent thermoelectric properties. However, as they exhibit poor phase stability at a low temperature of about 580° C. or lower corresponding to the general operating temperature of a thermoelectric element, there is a problem that they are very limited in application as a thermoelectric conversion material.

DETAILED DESCRIPTION OF THE INVENTION

Technical Problem

An object of the present invention is intended to provide a novel chalcogen-containing compound which exhibits excellent phase stability even at a low temperature, particularly in the operating temperature range of a thermoelectric element, and also exhibits excellent thermoelectric properties along with low thermal conductivity, and a method for preparing the same.

Another object of the present invention is intended to provide a thermoelectric element which includes the above-mentioned chalcogen-containing compound and thus exhibits excellent thermoelectric properties.

Technical Solution

The present invention provides a chalcogen-containing compound represented by the following Chemical Formula 1:

$$V_{1-2x}Sn_4Bi_{2-x}Ag_{3x}Se_7 \quad \text{[Chemical Formula 1]}$$

wherein, in the above Formula 1, V is vacancy and 0<x<0.5.

The present invention also provides a method for preparing the above-mentioned chalcogen-containing compound including the steps of: mixing raw materials of Sn, Bi, Ag, and Se and then melting the raw materials to prepare a melt; heat-treating the melt; pulverizing the resultant product obtained through the heat treatment; and sintering the pulverized product.

In addition, the present invention provides a thermoelectric element including the aforementioned chalcogen-containing compound as a thermoelectric conversion material.

Hereinafter, the chalcogen-containing compound according to specific embodiments of the present invention, the method for preparing the same, and the thermoelectric element including the same will be described in more detail.

According to one embodiment of the present invention, a chalcogen-containing compound represented by the following Chemical Formula 1 is provided:

$$V_{1-2x}Sn_4Bi_{2-x}Ag_{3x}Se_7 \quad \text{[Chemical Formula 1]}$$

wherein, in the above Formula 1, V is vacancy and 0<x<0.5.

The chalcogen-containing compound of the one embodiment is a compound having a vacant site to which Ag is added in a chalcogen compound such as $Sn_4Bi_2Se_7$ and has an identical crystal lattice structure to that of $Sn_4Bi_2Se_7$, that is, a face-centered cubic crystal lattice structure that is identical to that of sodium chloride.

Specifically, in the face-centered cubic lattice structure of the chalcogen-containing compound of the one embodiment, the Se is filled in an anion site of the face-centered cubic lattice, the Sn and Bi are filled in a cationic site of the face-centered cubic lattice, and the Ag is substituted by replacing a part of the Bi. In addition, the face-centered cubic lattice structure includes a vacancy in a vacant site excluding the sites filled with Se, Sn, Bi, and Ag.

As a part of Bi is substituted with Ag as described above, it is possible to exhibit excellent phase stability even at a temperature range corresponding to the operating temperature of the thermoelectric element, for example, at a low temperature of about 580° C. or less. As shown in FIG. 4, such excellent phase stability can be confirmed from the viewpoint that even when the chalcogen-containing compound of the one embodiment is finally produced in the form of a sintered body and then left, decomposition of the compound does not occur, the same XRD pattern is maintained, and the same crystal structure is maintained.

In particular, when the molar ratio of Bi:Ag satisfies the condition of 2-x:3x, it is possible to form a single phase without a secondary phase. As a result, it is possible to exhibit excellent phase stability even at a relatively low temperature. Ag supplies one electron as $Ag^{1+}$, and Bi supplies three electrons as $Bi^{3+}$. This is because three Ag atoms must replace one Bi atom in order to match the charge neutrality.

Further, the chalcogen-containing compound of the one embodiment can improve the power factor (PF) and the thermoelectric performance index (ZT) since Ag is contained by replacing a part of Bi.

The thermoelectric performance index is defined as $ZT=S^2\sigma T/K$ (S: Seebeck coefficient, σ: electrical conductivity, T: absolute temperature, and K: thermal conductivity). The chalcogen-containing compound of one embodiment can exhibit an excellent power factor and thermoelectric performance index (ZT) due to high electrical conductivity and low thermal conductivity. In addition, such an improvement effect can be further increased due to the increase in the electrical conductivity according to the increase in the hole charge carrier concentration as the content of Ag increases.

In detail, in the face-centered cubic lattice structure, Sn, Bi, and the like filling each cationic site can be positively ionized and supply electrons. As is also demonstrated in examples described later, the chalcogen-containing compound of the one embodiment can exhibit excellent electrical conductivity by substituting a part of Bi with Ag. Further, as the content of the substituted Ag increases, the electrical conductivity increases. This is because $Bi^{3+}$ supplies three electrons and $Ag^{1+}$ supplies one electron, and therefore, as the Ag content increases, more hole charge carriers can be provided.

On the other hand, as the content of Ag which is substituted for Bi increases, $K_E$ increases due to the increase in the concentration of the hole charge carrier, thus increasing the total thermal conductivity. In the chalcogen-containing compound of this embodiment, the phonon scattering effect due to the mass difference between Bi and Ag becomes prominent as the Ag content increases. Thus, by lowering the lattice thermal conductivity, the total thermal conductivity is lowered.

In addition, the chalcogen-containing compound of this embodiment shows a positive (+) or negative (−) Seebeck coefficient such that it is applicable as a thermoelectric conversion material. The sign of the Seebeck coefficient can be determined according to the substitution amount of Ag. Specifically, when the Ag content (3x) is less than 0.19, it shows a negative Seebeck coefficient since the major charge carriers are electrons. When the Ag content is 0.19 or more, it shows a positive Seebeck coefficient. In particular, when the Ag content increases to 0.37 or more, the supply of electrons is reduced. The major charge carriers of the thermoelectric material change into holes, and thereby show characteristic changes from n-type to p-type semiconductor material. This is because $Ag^{1+}$ supplies fewer electrons to the thermoelectric material compared to $Bi^{3+}$, and thereby, the hole charge concentration is increased. On the other hand, even if they have the same Ag content, electrons are supplied from Ag to the thermoelectric material when Ag is simply filled in the vacancy, thereby showing a negative Seebeck coefficient.

On the other hand, the face-centered cubic lattice structure of the chalcogen-containing compound of this embodiment includes a vacancy in which the Se, Sn, Bi, and Ag are not completely filled in the vacant lattice sites, and some vacant sites remain.

The vacancies are in a state in which atoms of lattice points are deficient in a specific crystal lattice structure. As is also demonstrated by examples described below, the vacancies play a very important role in forming the same face-centered cubic lattice structure as that of sodium chloride. If the vacancies are completely filled with Bi, Se, Sn, or Ag, secondary phases having different structures than the face-centered cubic lattice structure may be formed together, and as a result, the physical properties such as electrical conductivity are lowered, and there is a problem that it is difficult to apply to a thermoelectric conversion material.

In addition, since the vacancy facilitates diffusion of atoms, heat treatment, deformation, precipitation, or phase transformation may be varied depending on the presence or absence of the vacancies. In the case of the chalcogen-containing compound of the one embodiment, low lattice thermal conductivity can be exhibited by the phonon scattering by vacancies, and due to this, excellent thermoelectric conversion characteristics can be exhibited.

On the other hand, in Chemical Formula 1, V, Bi, and Ag are contained in the molar ratio of 1-2x, 2-x, and 3x, wherein x may be greater than 0 and less than 0.5. When x is 0.5 or more, vacancies may not exist in the lattice structure. More specifically, x may be 0.05 to 0.4, and still more specifically, x may be 0.06 or more and less than 0.1, or 0.1 to 0.375. As these mole ratios are satisfied, the compound of one embodiment may exhibit superior phase stability due to the substitution of Ag for Bi while maintaining a unique crystal lattice structure, and also it can show low thermal conductivity by including vacant lattice sites and vacancies. In addition, the molar ratio of Bi and Ag to supply electrons is optimized, and thus, superior electrical conductivity can be exhibited.

Specific examples of the chalcogen-containing compound include $V_{0.875}Sn_4Bi_{1.9375}Ag_{0.1875}Se_7$, $V_{0.75}Sn_4Bi_{1.875}Ag_{0.375}Se_7$, $V_{0.25}Sn_4Bi_{1.625}Ag_{1.125}Se_{71}$, or the like.

As described above, the chalcogen-containing compound of one embodiment solves the problem of poor phase stability of conventional thermoelectric materials such as $Sn_4Bi_2Se_7$, and thus exhibits excellent phase stability even in a general operating temperature of a thermoelectric element, and further exhibits excellent electrical conductivity, low thermal conductivity, and excellent thermoelectric conversion properties due to a unique crystal lattice structure. As a result, the chalcogen-containing compound of the one embodiment can be very suitably used as a thermoelectric conversion material in various fields and applications including various thermoelectric cooling systems, thermoelectric power generation systems, and the like.

On the other hand, according to another embodiment of the present invention, a method for preparing the above-mentioned chalcogen-containing compound is provided.

Specifically, the preparation method may include the steps of: mixing raw materials of Sn, Bi, Ag, and Se and then melting them to prepare a melt; heat-treating the melt; pulverizing the resultant product obtained through the heat treatment; and sintering the pulverized product.

In the aforementioned preparation method, as the raw materials of Sn, Bi, Ag, and Se, a powder of the respective metal elements, or a compound containing the respective metal elements may be used, and more specifically, respective metal elements of Sn, Bi, Ag, and Se may be used.

Further, the mixing of these respective raw materials can be carried out by mixing the raw materials at a molar ratio of the respective elements (Sn:Bi:Ag:Se) in Chemical Formula 1, that is, at a ratio corresponding to 4:2−x:3x:7 (where 0<x<0.5), and then grinding or milling the mixture and optionally pelletizing it. The mixture thus formed may be in a powder state, a pellet state, or an ingot state depending on its formation step.

Then, a step of melting the mixture prepared as above is carried out.

During the melting step, the reaction between the metal raw materials of the aforementioned metals is performed, and the result of the reaction is obtained in the form of a melt.

Specifically, the melting step can be carried out by charging the mixture into a quartz tube and then heating it at a temperature of 750 to 1000° C., more specifically a temperature of 900 to 1000° C., under a vacuum and in a sealed state. At this time, in order to prevent the reaction between the raw material and the quartz tube, the mixture may be first placed in a carbon crucible and then charged into a quartz tube. During the melting step, a solid-phase reaction between the raw materials of the metal is carried out.

Next, a step of heat-treating the melt obtained through the melting step is carried out. The heat treatment is a step for forming a single phase of face-centered cubic lattice structure. Specifically, it can be carried out at a temperature of 500 to 700° C., and more specifically, 600 to 700° C. for 24 to 72 hours. Further, the heat treatment may be carried out in a furnace such as an electric furnace, and it can be carried out under vacuum or in an inert gas atmosphere.

In addition, the heat treatment step may be carried out in a single step or may be performed in two or more steps.

Further, prior to the heat treatment after the step of preparing the melt, a step of cooling the melt may be further carried out as needed. Through this cooling step, the time of the heat treatment step can be shortened.

The cooling step may be carried out by a conventional method such as natural cooling or cold air cooling, and it can be carried out until the temperature of the melt reaches the level of room temperature (23±5° C.).

Further, after the heat treatment step, a step of pulverizing the heat-treated product is carried out.

The pulverizing step may be carried out using previously known methods and devices for producing thermoelectric conversion materials. Through this pulverizing step, a resultant product in a powder state can be obtained.

On the other hand, between the heat treatment step and the pulverization step, a step of cooling the resultant of the heat treatment step to form an ingot may be further carried out as needed.

At this time, the cooling step may be carried out using various cooling media, and all of cooling devices/cooling methods previously applied in the manufacturing process of thermoelectric conversion materials can be applied without particular limitation. In the case of forming ingots through this cooling step, a step of pulverizing the ingots may be carried out.

Further, after the pulverizing step described above, a step of sintering the pulverized product is carried out. By progression of this sintering step, the above-mentioned chalcogen-containing compound of one embodiment can be produced in the form of a sintered body. Such a sintering step can be carried out by a spark plasma sintering method or the like that are well-known to those skilled in the art.

The sintering step may be carried out, specifically, at a temperature of 550 to 700° C. under a pressure of 10 to 130 MPa. More specifically, it may be carried out at a temperature of 550 to 640° C. under a pressure of 30 to 100 MPa for 5 to 10 minutes.

After the sintering step, a cooling step may be further carried out as needed.

Each of the above-described steps may be carried out by applying conventional manufacturing conditions, methods, and devices for forming a thermoelectric conversion material or a metal compound such as a chalcogen compound. Specific reaction conditions and methods are described in examples provided later, so an additional description thereof will be omitted.

On the other hand, according to another embodiment of the present invention, a thermoelectric element including the chalcogen-containing compound of the above-mentioned one embodiment as a thermoelectric conversion material is provided. Such a thermoelectric element can include the chalcogen-containing compound as a p-type or n-type thermoelectric conversion material. For this purpose, as the thermoelectric conversion material of the one embodiment, additional p-type or n-type elements may be included in an additionally doped state. However, the kinds of the p-type element or n-type element and the doping method usable herein are not particularly limited, and elements and doping methods which have been conventionally used for applying thermoelectric conversion materials as p-type or n-type may be applied.

The thermoelectric element may include a thermoelectric element formed by obtaining the p-type or n-type thermoelectric conversion materials in a sintered state, and then processing and molding it, and may also include an insulating substrate and an electrode. The coupling structure of the thermoelectric element, the insulating substrate, and the electrode may conform to the structure of a conventional thermoelectric element.

In addition, as the insulating substrate, a sapphire substrate, a silicon substrate, a Pyrex substrate, a quartz substrate, or the like can be used. As the electrode, an electrode containing an arbitrary metal or a conductive metal compound can be used.

As the above-mentioned thermoelectric element includes the thermoelectric conversion material of one embodiment, it can exhibit excellent thermoelectric conversion characteristics, and the like, and it can be suitably applied to a thermoelectric cooling system or a thermoelectric power generation system in various fields and applications.

Advantageous Effects

According to the present invention, a novel chalcogen-containing compound which exhibits excellent phase stability even at a temperature corresponding to the operating temperature of a thermoelectric element, and also has low thermal conductivity and excellent thermoelectric properties, and a method for preparing the same, can be provided.

In addition, a thermoelectric element exhibiting excellent properties by applying such chalcogen-containing compound can be provided.

BRIEF DESCRIPTION OF THE DRAWINGS

FIG. 1 is a schematic view showing a face-centered cubic lattice structure represented by sodium chloride or the like.

DETAILED DESCRIPTION OF THE EMBODIMENTS

Hereinafter, the present invention will be described in more detail by way of examples. However, these examples are given for illustrative purposes only and are not intended to limit the scope of the invention thereto.

Example 1: Preparation of Chalcogen-Containing Compound of $V_{0.875}Sn_4Bi_{1.9375}Ag_{0.1875}Se_7$ The respective powders of Sn, Bi, Ag, and Se, which are high purity raw materials, were weighed at a molar ratio of 4:1.9375:0.1875:7 in a glove box and placed in a graphite crucible, and then charged into a quartz tube. The inside of the quartz tube was evacuated and sealed. Then, the raw materials were kept at a constant temperature in an electric furnace at 980° C. for 24 hours, and slowly cooled at room temperature. Subsequently, heat treatment was carried out at a temperature of 640° C. for 48 hours. The quartz tube in which the reaction had progressed was cooled with water to obtain an ingot. The ingot was finely pulverized into a powder having a particle size of 75 μm or less, and sintered according to a spark plasma sintering method (SPES) at a pressure of 50 MPa and a temperature of 620° C. for 10 minutes to prepare a chalcogen-containing compound of $V_{0.875}Sn_4Bi_{1.9375}Ag_{0.1875}Se_7$.

Example 2: Preparation of Chalcogen-Containing Compound of $V_{0.75}Sn_4Bi_{1.875}Ag_{0.375}Se_7$ A chalcogen-containing compound of $V_{0.75}Sn_4Bi_{1.875}Ag_{0.375}Se_7$ was prepared in the same manner as in Example 1, except that Sn, Bi, Ag, and Se, which are high purity raw materials, were mixed at a molar ratio of 4:1.875:0.375:7.

Example 3: Preparation of Chalcogen-Containing Compound of $V_{0.25}Sn_4Bi_{1.625}Ag_{1.125}Se_7$ A chalcogen-containing compound of $V_{0.25}Sn_4Bi_{1.625}Ag_{1.125}Se_7$ was prepared in the same manner as in Example 1, except that Sn, Bi, Ag, and Se, which are high purity raw materials, were mixed at a molar ratio of 4:1.625:1.125:7.

Comparative Example 1: Preparation of Chalcogen-Containing Compound of $Sn_4Bi_2Se_7$ A chalcogen-containing compound of $Sn_4Bi_2Se_7$ was prepared in the same manner as in Example 1, except that the respective powders of Sn, Bi, and Se, which are high purity raw materials, were mixed at a molar ratio of 4:2:7.

Comparative Example 2: Preparation of Chalcogen-Containing Compound of $V_{0.625}Ag_{0.375}Sn_4Bi_2Se_7$ A chalcogen-containing compound of $V_{0.625}Ag_{0.375}Sn_4Bi_2Se_7$ was prepared in the same manner as in Example 1, except that Ag, Sn, Bi, and Se, which are high purity raw materials, were mixed at a molar ratio of 0.375:4:2:7.

Experimental Example

1. Phase Analysis According to XRD Pattern

Figure 3:
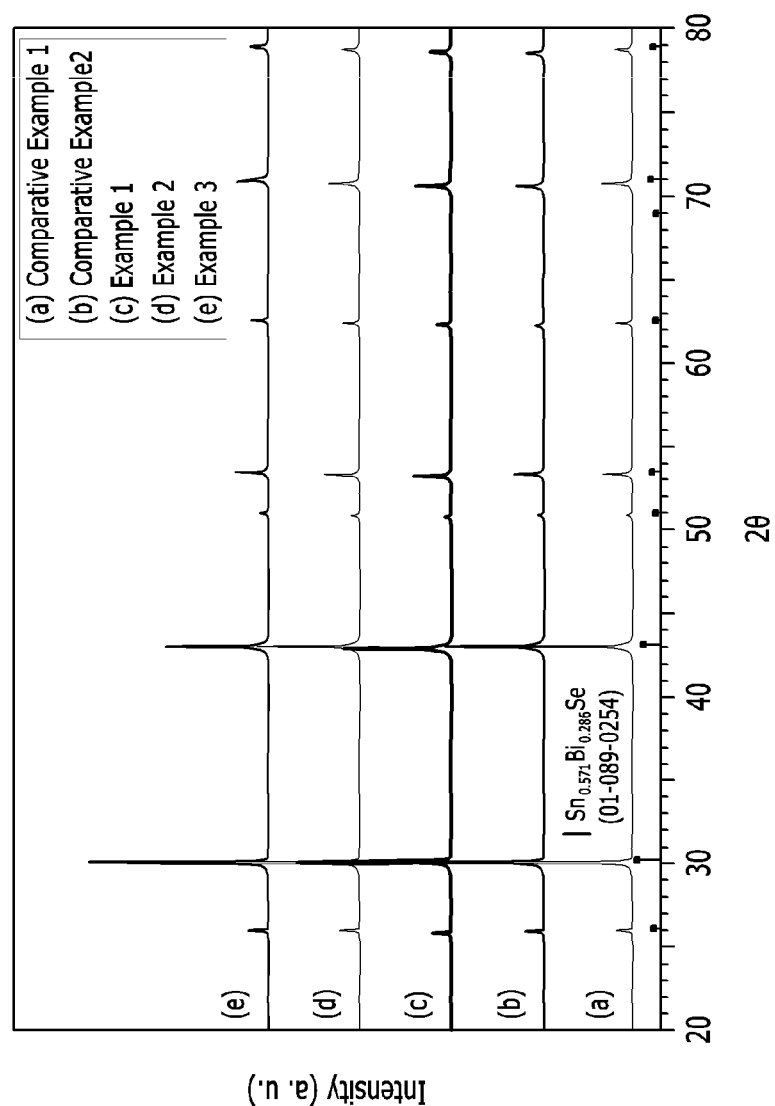
FIG. 3 illustrates the results of X-ray diffraction analysis of the chalcogen-containing compound powder just before the sintering step in Examples 1 to 3 and Comparative Examples 1 and 2.

For the chalcogen compounds in a powder state just before the sintering step in Examples 1 to 3 and Comparative Examples 1 and 2, X-ray diffraction analysis was carried out, and the results are shown in FIG. 3.

In addition, the respective sintered body finally produced through the sintering step in Examples 1 to 3 and Comparative Examples 1 and 2 was gradually cooled from about 620° C. to 300° C. and then cooled again to room temperature (25° C.). Then, the resultant sintered body was maintained in the air atmosphere for 15 days, and X-ray diffraction analysis of each sintered body was performed. The results are shown in FIG. 4.

First, referring to FIG. 3, the chalcogen compounds of Examples 1 to 3 and Comparative Examples 1 and 2 were confirmed to have the same crystal lattice structure as that of $Sn_4Bi_2Se_7$ which was conventionally known to have a face-centered cubic lattice structure at a high temperature. From these results, it was confirmed that the chalcogen compounds of Examples 1 to 3 and Comparative Examples 1 and 2 all had a face-centered cubic crystal lattice structure.

Figure 4:
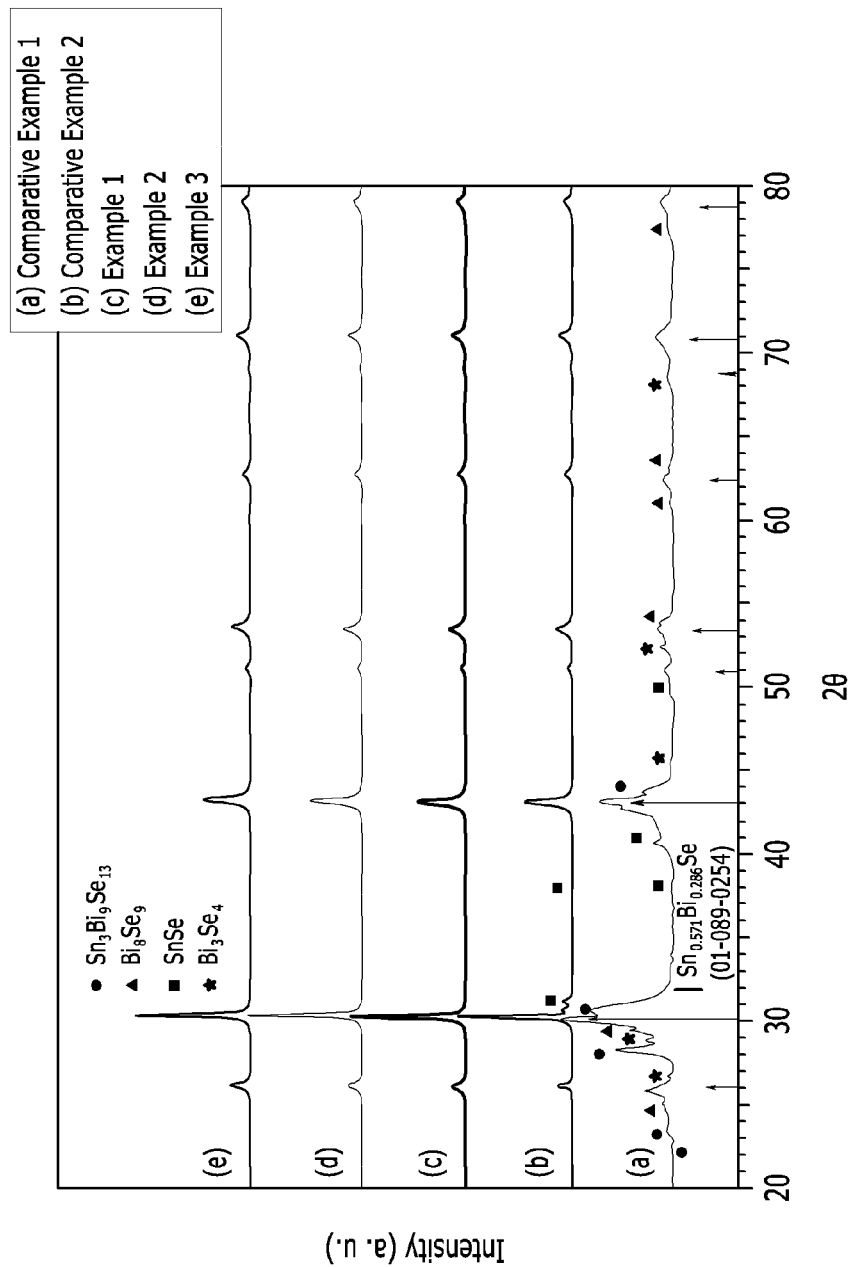
FIG. 4 is a graph showing the results of X-ray diffraction analysis after the sintered body finally produced through the sintering step in Examples 1 to 3 and Comparative Examples 1 and 2 is slowly cooled and left to stand at room temperature.

On the other hand, referring to FIG. 4, it was confirmed that as the chalcogen-containing compound of Comparative Example 1 exhibits poor phase stability when left at a relatively low temperature, the decomposition of the chalcogen-containing compound of $Sn_4Bi_2Se_7$ and a plurality of secondary phases ($Sn_3Bi_9Se_{13}$, $Bi_3Se_4$, $Bi_8Se_9$, and SnSe) were formed (peaks occurred in the plurality of secondary phases on the XRD pattern were observed). This shows that, as can be confirmed from the state diagram, $Sn_4Bi_2Se_7$ has poor phase stability at a temperature other than a specific temperature, and thus decomposition occurs. Therefore, the material of Comparative Example 1 has a limit in that it can not be used as a thermoelectric material.

In the case of Comparative Example 2 in which extra Ag was added to the chalcogen-containing compound of Comparative Example 2, a SnSe secondary phase of an orthorhombic structure was formed in addition to the material of a single-phase rock-salt structure.

In contrast, it was confirmed that the chalcogen compounds of Examples 1 to 3 maintain the face-centered cubic lattice structure without the generation of secondary phases, and exhibit excellent phase stability. Thus, only when replacing a part of Bi with Ag is it possible to maintain a single phase without a secondary phase. In particular, when the molar ratio of Bi:Ag satisfies the relation of 2-x:3x, it forms a single phase. This is because Ag supplies one electron as $Ag^{1+}$ and Bi supplies three electrons as $Bi^{3+}$, and therefore, three Ag atoms must replace one Bi atom in order to match the charge neutrality. From this, it is confirmed that Examples 1 to 3 exhibit excellent phase stability even at a relatively low temperature.

In addition, the lattice parameter and the composition were calculated for each of the chalcogen compounds in power state of Examples 1 to 3 and Comparative Examples 1 and 2 using the TOPAS program, and the results are shown in Table 1 below.

TABLE 1

| | Comparative Example 1 | Comparative Example 2 | Example 1 | Example 2 | Example 3 |
|---|---|---|---|---|---|
| Lattice parameter (Å) | 5.9437 | 5.9545 | 5.9521 | 5.9457 | 5.9297 |
| Vacancy (0, 0, 0) occupancy | 0.1429 | 0.09799 | 0.125 | 0.1054 | 0.0304 |
| Sn (0, 0, 0) occupancy | 0.5714 | 0.5668 | 0.5714 | 0.5714 | 0.5735 |
| Bi (0, 0, 0) occupancy | 0.2857 | 0.283 | 0.2768 | 0.2679 | 0.2333 |
| Ag (0, 0, 0) occupancy | 0 | 0.05221 | 0.0268 | 0.0536 | 0.1628 |
| Se (0.5, 0.5, 0.5) occupancy | 1 | 1 | 1 | 1 | 1 |
| Rwp | 5.84 | 6.02 | 5.71 | 5.91 | 6.44 |

Figure 5:
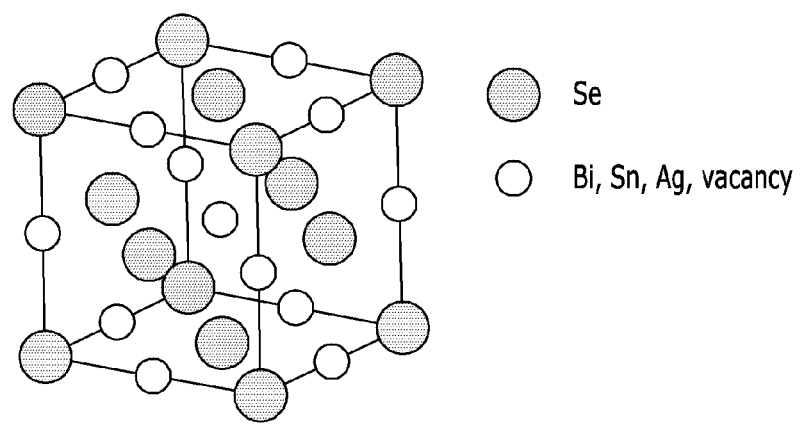
FIG. 5 is a schematic view of a face-centered cubic lattice structure of the chalcogen-containing compound according to an embodiment of the present invention.

FIG. 5 is a schematic diagram of a face-centered cubic lattice structure, or a rock-salt structure including defects of a chalcogen-containing compound according to one embodiment of the invention. FIG. 5 is presented for illustrative purposes only, and is not intended to limit the scope of the present invention thereto.

Looking at a scheme of a chalcogen-containing compound having a composition of $V_{1-2x}Sn_4Bi_{2-x}Ag_{3x}Se_7$ with reference to Table 1 and FIG. 5, V (vacancy), Sn, Ag, and Bi are randomly distributed at the site of (x, y, z)=(0, 0, 0), and Se is distributed at the site of (0.5, 0.5, 0.5). As shown in Table 1, this is the same as the result of Rietveld refinement calculated via the TOPAS program. As a result of calculating the actual composition, it can be seen that it is very similar to the nominal composition initially added. It can be seen therefrom that as the chalcogen compounds of Examples 1 to 3 include vacancies and a part of Bi is substituted with Ag, the concentration of the vacancies is decreased. In addition, when comparing Examples 1 to 3, the lattice parameter shows a tendency to decrease as the Ag content substituted at the site of Bi increases. This is because the atomic radius of Ag is smaller than that of Bi, which indicates that Ag is well substituted at the site of Bi. However, in the case of Comparative Example 2, if the Bi content is fixed and only Ag is further added, the lattice parameter is further increased relative to Example 2. This indicates that the lattice parameter increases as Ag partially fills the vacancies. (In the case of actual sintered body XRD, the SnSe secondary phase is detected in Comparative Example 2. The results of the Rietveld refinement are calculated using powder XRD without secondary phase).

2. Temperature Dependence of Electrical Conductivity

Figure 6:
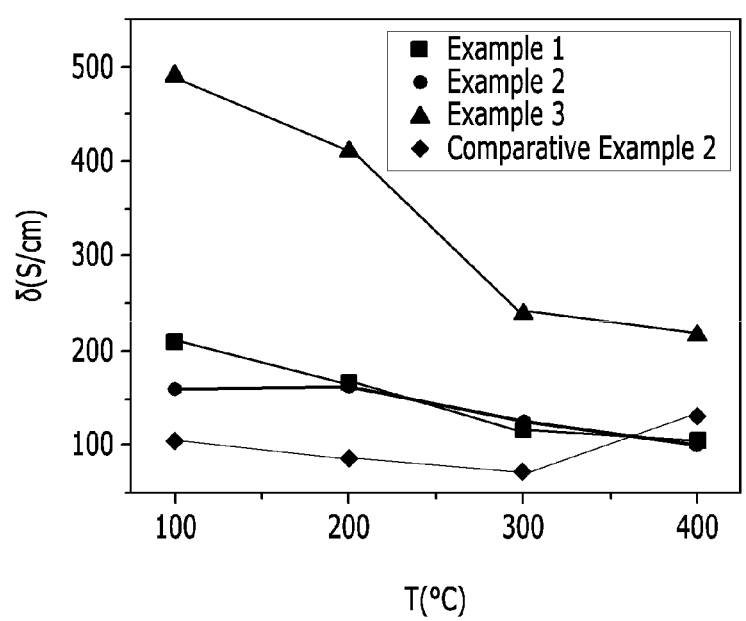
FIG. 6 is a graph showing the results of measuring electrical conductivity versus temperature of the chalcogen compounds in Examples 1 to 3 and Comparative Example 2.

For the chalcogen-containing compound samples prepared in Examples 1 to 3 and Comparative Example 2, the electrical conductivity was measured according to the temperature change, and the results are shown in FIG. 6. The electrical conductivity was measured at a temperature range of 100 to 400° C. by a four-probe DC method using LSR-3 (manufactured by Linseis), which is a resistivity measuring device.

Referring to FIG. 6, in the case of Comparative Example 2 in which extra Ag was added to $Sn_4Bi_2Se_7$, it contains a SnSe secondary phase and thus showed the lowest electrical conductivity. On the other hand, in the case of Examples 1 to 3 in which a part of Bi was substituted with Ag, the highest electrical conductivity was shown in Example 3 having a high content of Ag. This is because $Bi^{3+}$ supplies three electrons and $Ag^{1+}$ supplies one electron, and therefore, as the Ag content increases, more hole charge carriers can be provided. The chalcogen compounds prepared in Examples 1 and 2 show similar electrical conductivities. This is because, as can be seen from the sign of the Seebeck coefficient in FIG. 4, the actual charge carriers are electrons and holes in Examples 1 and 2, respectively, which are different from each other. That is, in Example 1, even when substituted with Ag, the main charge carriers of the material are still electrons. In Example 2 in which Ag was substituted, as the major charge carriers are changed from electrons to holes, the types of main charge carriers are different but the concentration of charge carriers is similar. As a result, Examples 1 and 2 show similar electrical conductivity.

Figure 1:
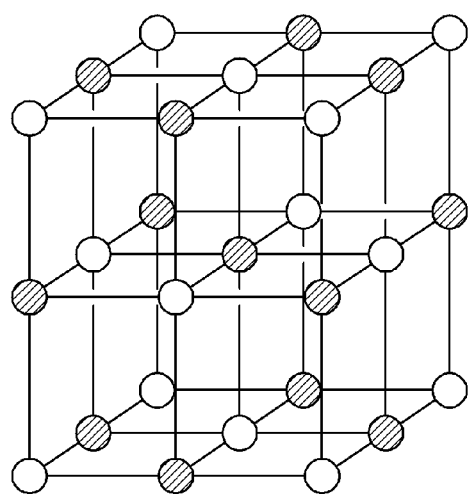
Figure 2:
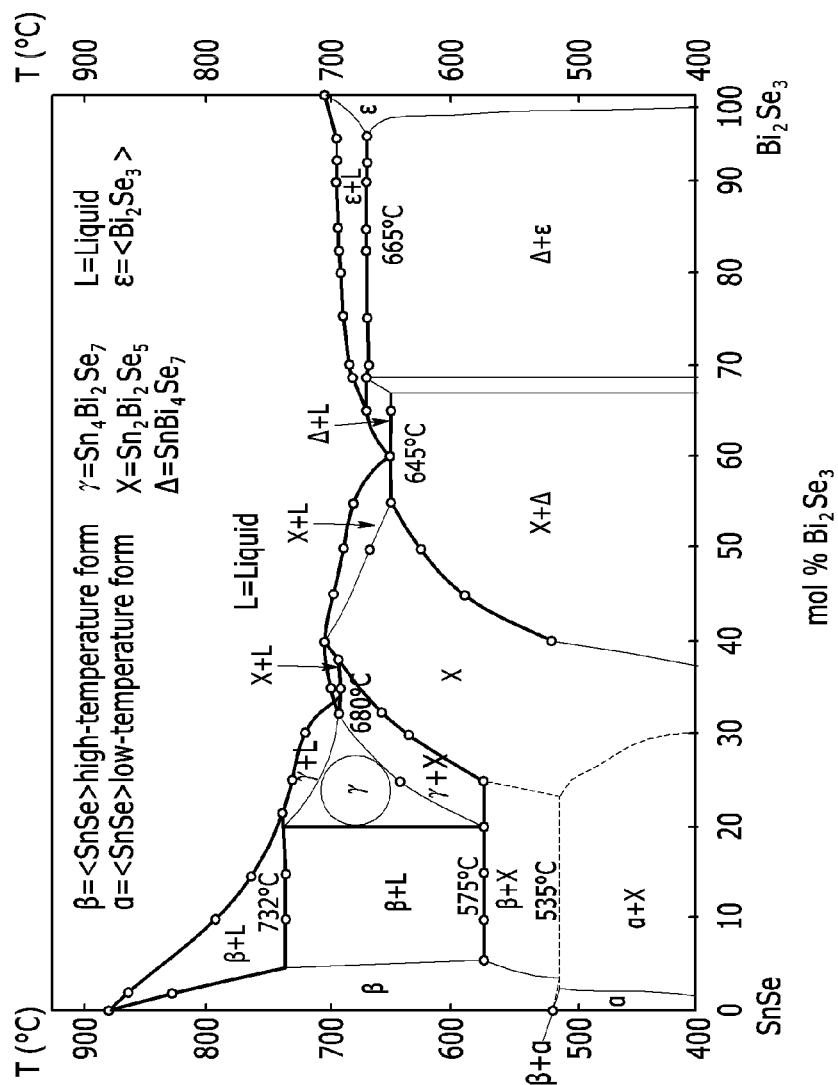
FIG. 2 is a phase stability diagram of typical Sn—Bi—Se based chalcogen compounds.

On the other hand, in Comparative Example 1, the thermoelectric characteristics could not be measured due to poor phase stability as observed in FIG. 2.

Figure 7:
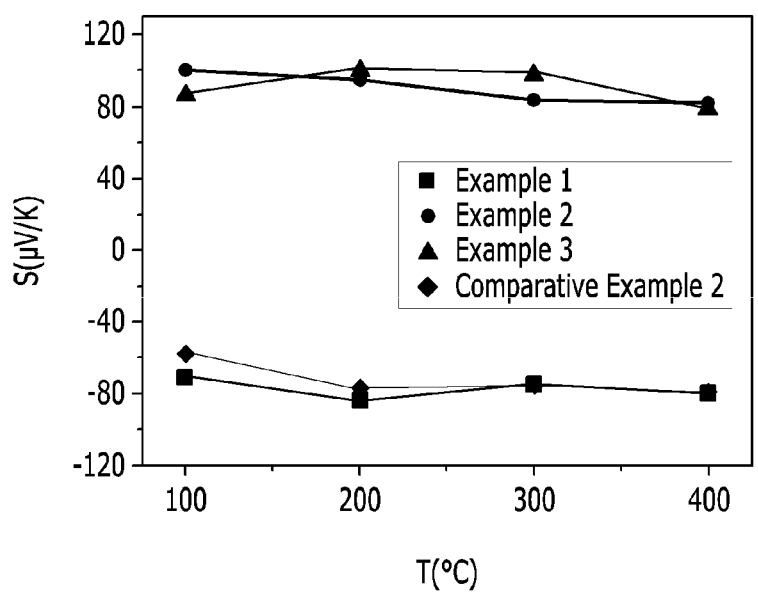
FIG. 7 is a graph showing the results of measuring the Seebeck coefficient versus temperature of the chalcogen compounds in Examples 1 to 3 and Comparative Example 2.

3. Measurement of Seebeck Coefficient and Temperature Dependence of Seebeck Coefficient For the chalcogen-containing compound samples prepared in Examples 1 to 3 and Comparative Example 2, the Seebeck coefficient (S) was measured according to the temperature change, and the results are shown in FIG. 7. The Seebeck coefficient was measured in a temperature range of 100 to 400° C. by using a measuring device LSR-3 (Linseis) and applying a differential voltage/temperature technique.

As shown in FIG. 6, it was confirmed that Examples 1 to 3 all exhibited a positive (+) or negative (−) Seebeck coefficient such that they are applicable as a thermoelectric conversion material.

On the other hand, in the case of Comparative Example 2 in which extra Ag was added, it shows a negative Seebeck coefficient, which indicates that electrons are supplied from $Ag^{1+}$ while Ag being filled in the vacancy, and the main carriers of the material are electrons.

Specifically, when comparing Examples 1 and 2 in which a part of Bi was substituted with Ag, it is confirmed that as the content of Ag increases from 0.1875 to 0.375, the Seebeck coefficient changes from negative (−) to positive (+) value. This means that in the case of Example 1, the main charge carriers are still electrons, but the supply of electrons is decreased and thus the major charge carriers of the material have been replaced with holes. This shows the characteristic change from an n-type to a p-type semiconductor material. In addition, this means that electrons with less $Ag^{1+}$ than $Bi^{3+}$ is supplied to the material, and thereby the concentration of hole charge increases. Similarly, the compound of Example 3 having a higher Ag content was confirmed to have a positive (+) Seebeck coefficient.

Further, when comparing Comparative Example 2 and Example 2 having a similar Ag content, it can be seen that in the case of Comparative Example 2 in which Ag was simply filled in the vacancy, electrons were supplied to the material from Ag and have a negative Seebeck coefficient, whereas in the case of Example 2 in which Bi was substituted, the supply of electrons was relatively insufficient (hole charge supply), so that it has a positive Seebeck coefficient. From this, it can be seen that Ag is properly substituted for the site of Bi.

4. Temperature Dependence of Power Factor

Figure 8:
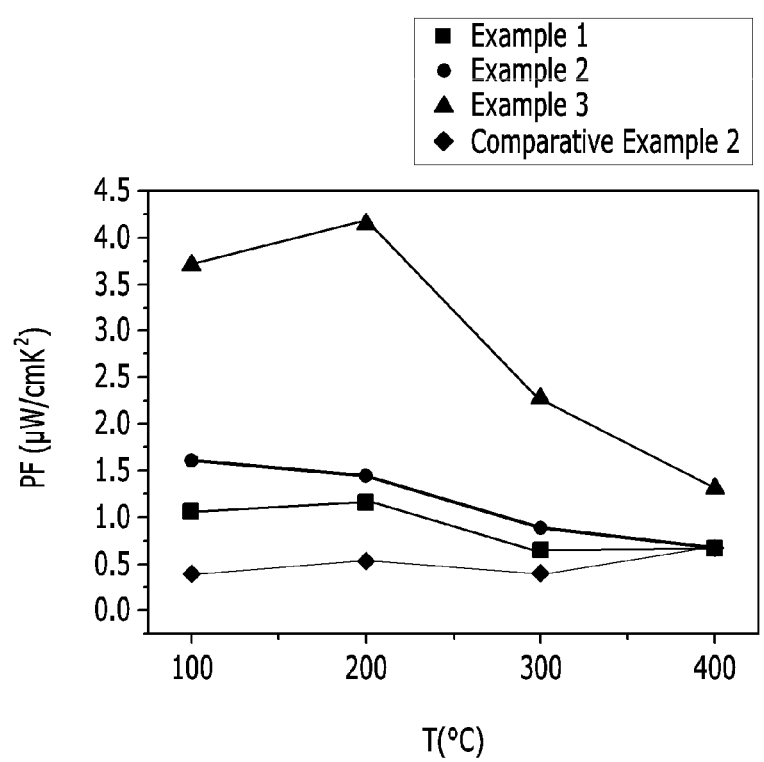
FIG. 8 is a graph showing the results of measuring the power factor versus temperature of the chalcogen compounds in Examples 1 to 3 and Comparative Example 2.

For the chalcogen-containing compound samples prepared in Examples 1 to 3 and Comparative Example 2, the power factor was calculated according to the temperature change, and the results are shown in FIG. 8.

The power factor is defined as power factor $(PF)=\sigma S^2$, and was calculated using the values of σ (electrical conductivity) and S (Seebeck coefficient) shown in FIG. 3 and FIG. 4.

As shown in FIG. 8, in the case of Comparative Example 2 where extra Ag was filled in the vacancies, it showed a low power factor, and in particular, it showed a lower power factor than Example 2 in which the content of Ag was similar but a part of Bi was substituted. In the case of Comparative Example 2, such a result is attributed to the low electrical conductivity and Seebeck coefficient together with the formed SnSe secondary phase.

In addition, when comparing Examples 1 to 3 in which a part of Bi was substituted with Ag, as the content of Ag increased, the power factor increased, and in Example 3 where the content of Ag is the highest, the highest power factor was exhibited due to the increase of the electrical conductivity caused by the increase in the hole charge concentration. In particular, it was confirmed that the power factor measured at 200° C. was as high as about 4.15 $\mu W/cmK^2$.

Figure 9:
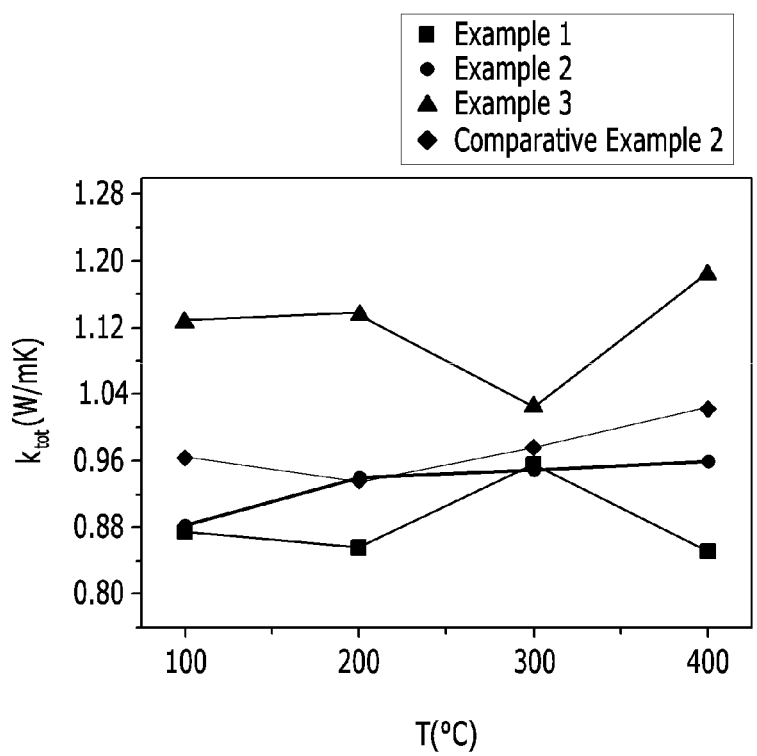
FIG. 9 is a graph showing the results of measuring the total thermal conductivity versus temperature of the chalcogen compounds in Examples 1 to 3 and Comparative Example 2.
Figure 10:
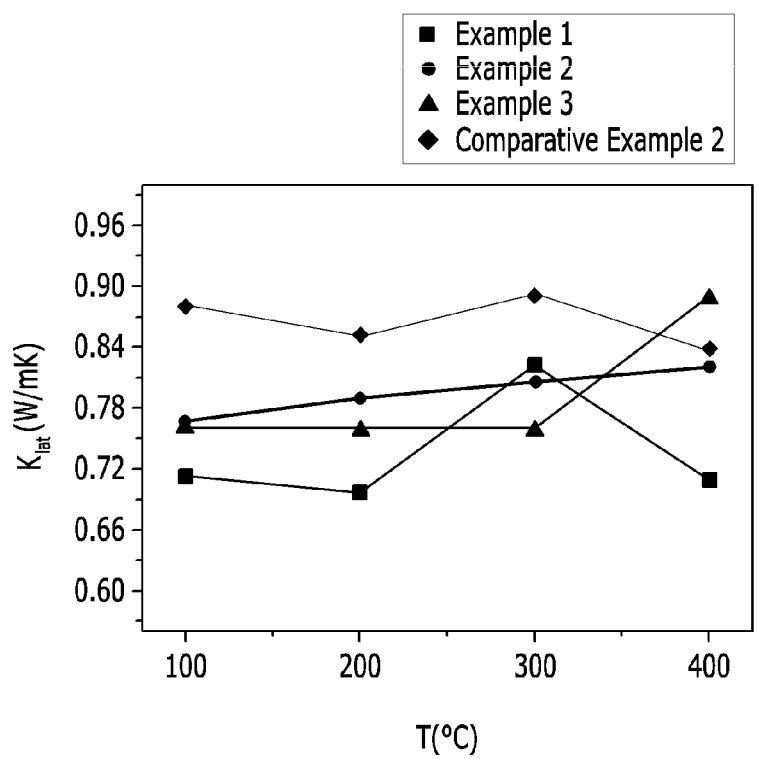
FIG. 10 is a graph showing the results of calculating the lattice thermal conductivity versus temperature of the chalcogen compounds in Examples 1 to 3 and Comparative Example 2.

5. Temperature Dependence of Thermal Conductivity and Lattice Thermal Conductivity For the chalcogen-containing compound samples prepared in Examples 1 to 3 and Comparative Example 2, the thermal conductivity and the lattice thermal conductivity were measured according to the temperature change, and the results are shown in FIG. 9 and FIG. 10, respectively.

Specifically, the thermal diffusivity (D) and the thermal capacity ($C_p$) were measured by applying a laser scintillation method and using an LFA457 instrument (Netzsch) which is a device for measuring the thermal conductivity, and then the thermal conductivity (K) was calculated by applying the measured value to the following Equation 2.

$$\text{Thermal Conductivity } (K) = D\rho C_p \qquad \text{[Equation 2]}$$

Herein, D is the thermal diffusivity, $C_p$ is the thermal capacity, and p is the density of a sample measured by Archimedes method.

In addition, the total thermal conductivity ($K_{tot}=K_L+K_E$) is divided into the thermal conductivity ($k_E$) calculated according to the lattice thermal conductivity ($k_L$) and the Wiedemann-Franz law ($k_E=L\sigma T$), wherein the value calculated from the Seebeck coefficient versus temperature was used as the Lorentz number (L).

Referring to FIG. 9 and FIG. 10, in the case of Comparative Example 2, it showed high thermal conductivity despite having lower electrical conductivity than that of Example 2. This is because the lattice thermal conductivity is lowered by the phonon scattering by vacancies in Example 2 having higher vacancy content.

Further, in the case of Examples 1 to 3, as the content of Ag increased, the total thermal conductivity increased. In particular, in Example 3 having the largest content of Ag, the highest thermal conductivity was shown due to the increase of $K_E$ according to the increase in the hole charge carrier concentration.

Further, looking at the lattice thermal conductivities of Examples 1 to 3, in the case of Example 1 having the largest vacancy content, the lowest lattice thermal conductivity is exhibited by the phonon scattering effect by vacancies, but in the case of Example 3 having a lower vacancy content, it showed lattice thermal conductivity similar to that of Example 2. These results show that the phonon scattering effect due to the difference in mass of Bi and Ag becomes prominent as the Ag content increases, and the lattice thermal conductivity is lowered.

6. Temperature Dependence of Thermoelectric Performance Index (ZT)

Figure 11:
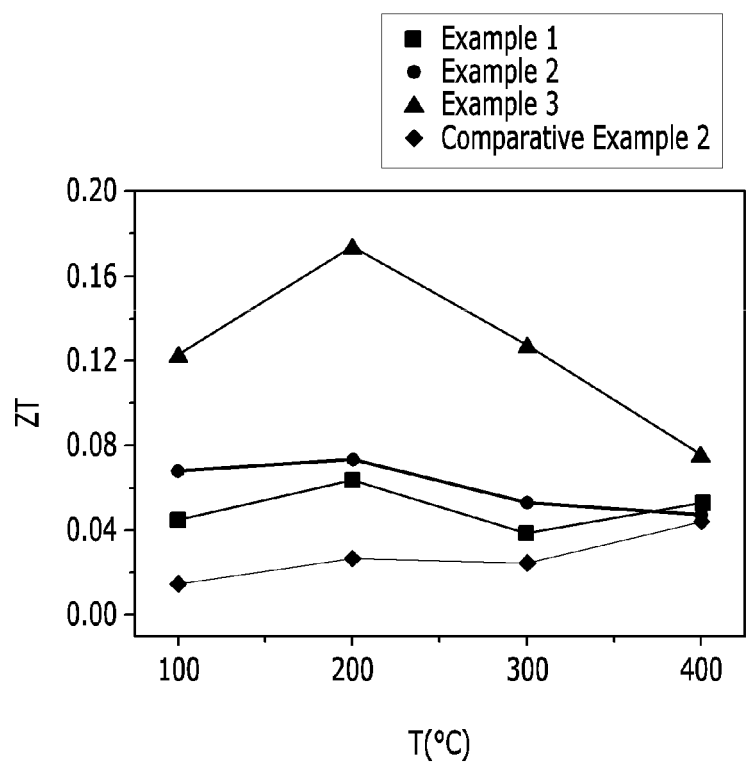
FIG. 11 is a graph showing the results of calculating the thermoelectric performance index versus temperature of the chalcogen compounds in Examples 1 to 3 and Comparative Example 2.

For the chalcogen-containing compound samples prepared in Examples 1 to 3 and Comparative Example 2, the thermoelectric performance index was calculated according to the temperature change, and the results are shown in FIG. 11.

The thermoelectric performance index is defined as $ZT=S^2\sigma T/k$, and was calculated by using the values of S (Seebeck coefficient), σ (electrical conductivity), T (absolute temperature), and k (thermal conductivity) obtained in the experimental examples.

Referring to FIG. 11, Example 2 in which the Ag content is similar but a part of Bi is substituted showed a higher thermoelectric performance index than that of Comparative Example 2, and in particular, the ZT value at 200° C. was increased by 170% as compared with Comparative Example 2.

Finally, in the case of Example 3 in which the substitution amount of Ag was further increased, it showed a more improved thermoelectric performance index, and the ZT value at 200° C. was increased by 180% as compared with Comparative Example 1.

The invention claimed is:

1. A chalcogen-containing compound represented by the following Chemical Formula 1:

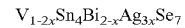

[Chemical Formula 1]

wherein, in the above Chemical Formula 1, V is a vacancy and wherein x is 0.05≤x≤0.4.

2. The chalcogen-containing compound of claim 1, wherein the compound has a face-centered cubic crystal lattice structure.

3. The chalcogen-containing compound of claim 2, wherein the vacancy is a vacant site excluding sites filled with Se, Sn, Bi, and Ag in the face-centered cubic crystal lattice structure, and the Ag is substituted by replacing a part of the Bi.

4. The chalcogen-containing compound of claim 2, wherein the Se is filled in an anion site of the face-centered cubic crystal lattice structure, the Sn and Bi are filled in a cationic site of the face-centered cubic lattice structure, the vacancy is a vacant site of the remaining sites excluding the sites filled with Se, Sn, and Bi, and the Ag is substituted by replacing a part of the Bi.

5. A thermoelectric conversion material comprising the chalcogen-containing compound according to claim 1.

6. A thermoelectric element comprising the chalcogen-containing compound according to claim 1.

7. A method for preparing the chalcogen-containing compound according to claim 1, comprising the steps of:

mixing raw materials of Sn, Bi, Ag, and Se and then melting the raw materials to prepare a melt;

heat-treating the melt;

pulverizing the resultant product obtained through the heat treatment; and sintering the pulverized product.

8. The method for preparing the chalcogen-containing compound of claim 7, wherein the raw materials of Sn, Bi, Ag, and Se are mixed at a molar ratio of Sn:Bi:Ag:Se corresponding to 4:2−x:3x:7, and the x is 0.05≤x≤0.4.

9. The method for preparing the chalcogen-containing compound of claim 7, wherein the melting is carried out at a temperature of 750 to 1000° C.

10. The method for preparing the chalcogen-containing compound of claim 7, wherein the heat treatment is carried out at a temperature of 500 to 700° C.

11. The method for preparing the chalcogen-containing compound of claim 7, further comprising a step of cooling the resultant of the heat treatment step to form an ingot between the heat treatment step and the pulverization step.

12. The method for preparing the chalcogen-containing compound of claim 7, wherein the sintering step is carried out by a spark plasma sintering method.

13. The method for preparing the chalcogen-containing compound of claim 7, wherein the sintering step is carried out at a temperature of 550 to 700° C. under a pressure of 10 to 130 MPa.

* * * * *